US006835456B2

United States Patent
Walter et al.

(10) Patent No.: US 6,835,456 B2
(45) Date of Patent: Dec. 28, 2004

(54) ANTIREFLECTIVE, LAYER-FORMING COMPOSITION, LAYER CONFIGURATION CONTAINING THE ANTIREFLECTIVE LAYER, AND PROCESS FOR PRODUCING THE ANTIREFLECTIVE LAYER

(75) Inventors: Andreas Walter, Egloffstein (DE); Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 44 days.

(21) Appl. No.: 10/154,297

(22) Filed: May 23, 2002

(65) Prior Publication Data

US 2002/0198294 A1 Dec. 26, 2002

(30) Foreign Application Priority Data

May 23, 2001 (DE) .......................... 101 25 372

(51) Int. Cl.[7] .............................. B05D 1/02; B05D 3/12; B32B 27/20; B32B 27/34; C08K 5/23
(52) U.S. Cl. .................. 428/411.1; 428/474.4; 524/190; 524/553; 524/555; 427/346; 427/368; 427/385.5; 427/422
(58) Field of Search .................. 427/346, 368, 427/385.5, 422; 524/190, 553, 555; 428/411.1, 474.4

(56) References Cited

U.S. PATENT DOCUMENTS

| | | | |
|---|---|---|---|
| 4,339,521 A | 7/1982 | Ahne et al. | 430/192 |
| 4,395,482 A | 7/1983 | Ahne et al. | 430/326 |
| 4,808,769 A | 2/1989 | Nakano et al. | 174/225 |
| 4,845,183 A | * 7/1989 | Mueller et al. | 528/185 |
| 4,849,051 A | 7/1989 | Ahne et al. | 216/48 |
| 4,857,671 A | 8/1989 | Nakano et al. | 174/259 |
| 5,104,773 A | 4/1992 | Ahne et al. | 430/326 |
| 5,652,317 A | 7/1997 | McCulloch et al. | 526/312 |

FOREIGN PATENT DOCUMENTS

| | | |
|---|---|---|
| EP | 0 264 678 A1 | 4/1988 |
| EP | 0 291 779 A2 | 11/1988 |
| EP | 0 450 189 A2 | 10/1991 |

\* cited by examiner

*Primary Examiner*—Ramsey Zacharia
(74) *Attorney, Agent, or Firm*—Laurence A. Greenberg; Werner H. Stemer; Ralph E. Locher

(57) ABSTRACT

A layer-forming antireflective composition is proposed which contains as a base polymer poly(hydroxyamide) or polybenzoxazole and as dye component at least one dye from the classes of the methine dyes, methine dye derivatives, azomethine dyes, azomethine dye derivatives, coumarin dyes, coumarin dye derivatives, triphenylmethane dyes, triphenylmethane dye derivatives and/or an azo dye.

12 Claims, 1 Drawing Sheet

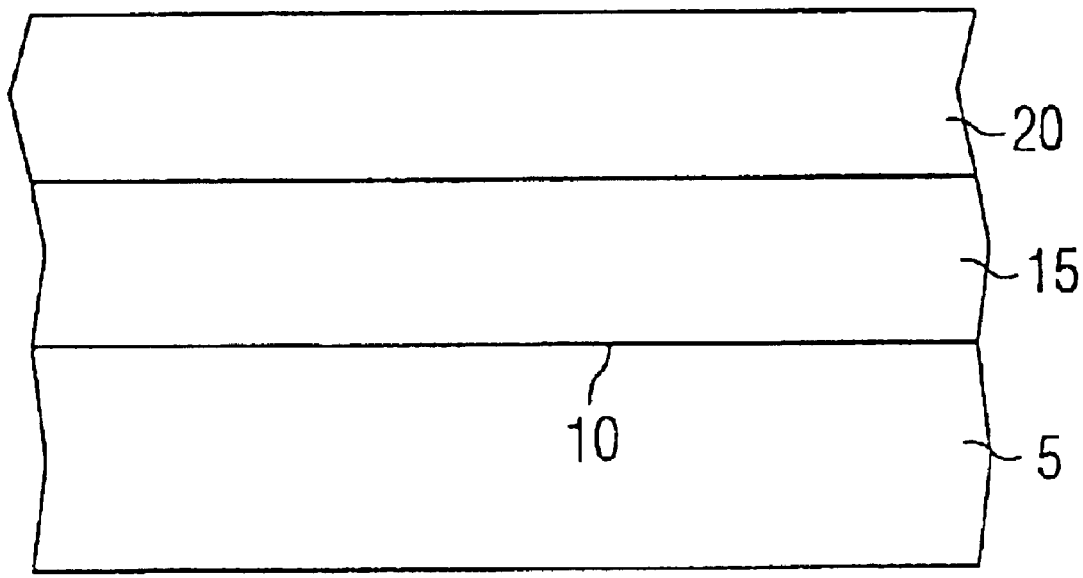

ANTIREFLECTIVE, LAYER-FORMING COMPOSITION, LAYER CONFIGURATION CONTAINING THE ANTIREFLECTIVE LAYER, AND PROCESS FOR PRODUCING THE ANTIREFLECTIVE LAYER

BACKGROUND OF THE INVENTION

Field of the Invention

Patterning in photolithography is carried out by exposing compounds known as photoresists and then developing them. During exposure, reflections from layers beneath the photoresist may significantly impair pattern quality and the faithfulness of the patterns to be reproduced. Antireflective layers are normally used in order to reduce the pattern quality deterioration due to light reflections.

Antireflective layers or coatings (ARC) have the function of absorbing light of the wavelength used to expose the photoresist. They are required to be highly compatible with the photoresist and must be able to be applied uniformly in the desired layer thickness. Compatibility between the antireflective layer and the photoresist comprehends the photoresist and the antireflective layer being able to be coated over one another without any detachment of the layers from one another or the formation of an undefined or even insoluble boundary between the two layers.

For resists of the kind known as chemical amplification resists (CAR) it would be deleterious were the antireflective layer to contain or release components which impair the performance of the CAR. Chemical amplification resists operate, for example, in accordance with the principle of acid catalysis, a strong acid being formed in the course of exposure. For chemical amplification resists, accordingly, the antireflective layer should not give a basic reaction and neutralize the acid.

In photolithography it is normal for different wavelengths to be used for exposing a resist. Consequently it is of advantage to produce antireflective layers that are suitable for use at different wavelengths.

It is prior art to produce a resist from a bottom resist and a top resist. In this case the bottom resist is applied first to the substrate and the top resist is then disposed on it. In the case of a multi-layer system the bottom resist is the lower or lowermost resist layer. Normally, the bottom resist is not photoreactive itself. Where, for example, a resist is formed from two layers, the top resist is exposed and gives a photoreactive reaction, so that it can subsequently be developed. The pattern thus produced in the top resist is normally transferred thereafter into the underlying bottom resist by appropriate process steps. This can be done, for example, using reactive ion etching with oxygen plasma, provided the top resist is stable to the plasma and the bottom resist can be etched with the plasma. Where the top resist contains silicon, for example, reactive ion etching can be carried out in an oxygen-containing plasma for the patterning of the bottom resist.

Where the bottom resist and/or the antireflective layer remains on the substrate, it must exhibit a high level of temperature stability which is able to withstand at least subsequent deposition of silicon oxide or silicon nitride to passivate a semiconductor substrate.

SUMMARY OF THE INVENTION

It is accordingly an object of the invention to provide an antireflective, a layer-forming composition, a layer configuration containing the antireflective layer, and a process for producing the antireflective layer which overcome the above-mentioned disadvantages of the prior art methods, compositions, and devices of this general type, in which the antireflective layer is adjustable in its absorption wavelength and is stable to temperatures above 400° C. In the context of the invention, antireflective compositions and antireflective layers relate to compositions and layers that absorb light of the wavelength used to expose the photoresist.

With the foregoing and other objects in view there is provided, in accordance with the invention, a layer-forming antireflective composition. The layer-forming antiflective composition of the invention contains the following components:

a) a base polymer containing a poly(hydroxyamide) and/or a polybenzoxazole; and b) a dye component selected from the following dye classes: methine dyes, methine derivatives, azomethine dyes and their derivatives, coumarin dyes and their derivatives, triphenylmethane dyes and their derivatives, and azo dyes and their derivatives.

For the purposes of the invention, derivatives of the individual dye classes are dyes that, with the same chromophoric group present, e.g., the azo group, possess different substituents on the chromophoric group.

Poly(hydroxyamides) are polymers with peptide linkages between their monomer units. The monomers of the poly(hydroxyamides) have the following general formulae C) and D):

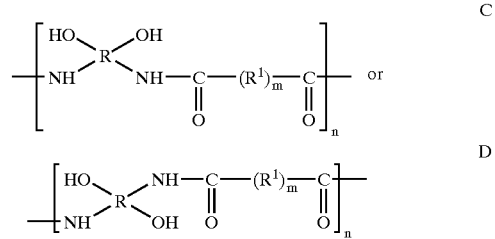

where n is an integer between 2 and about 100 and m is 0 or 1.

I) The group R is selected from the following aromatic and heteroaromatic groups:

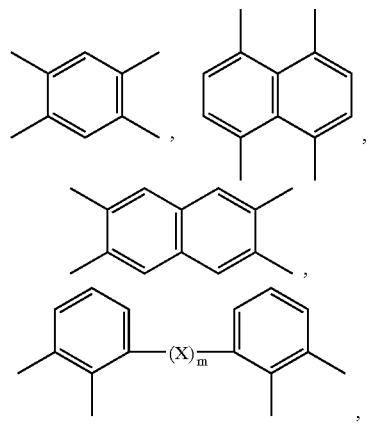

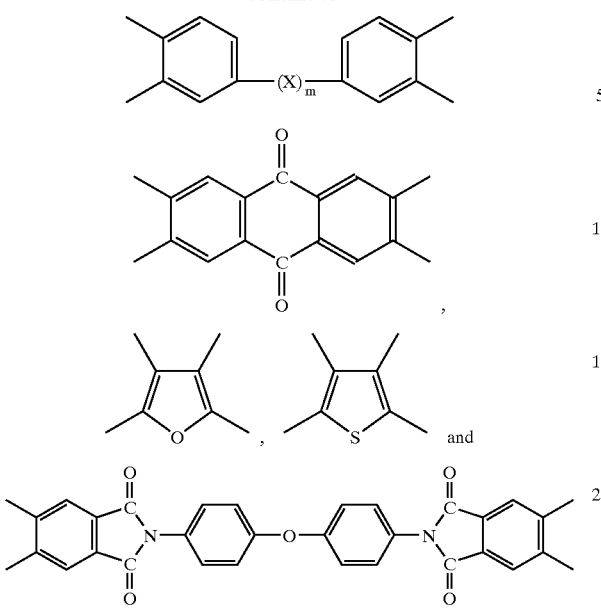
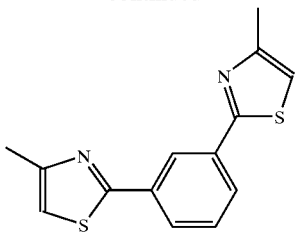
Groups suitable as the groups Y, Z, $Z^1$ and $Z^2$ listed under X include the following:
1) Y is selected from the following groups:
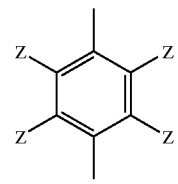
$-(CH_2)_o-$ where $o=2$ to 10 and
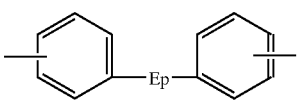
where $p=0$ or 1.
where Z is selected from the groups specified below under 2) and E is selected from the following groups:
where m is 0 or 1 and X is selected from the following groups:
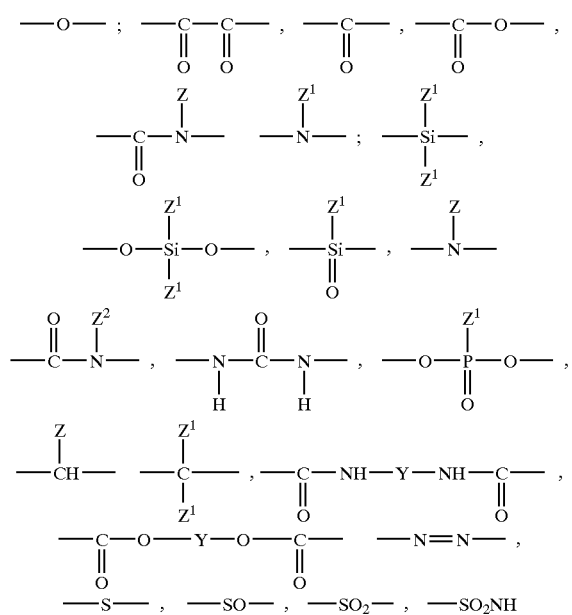
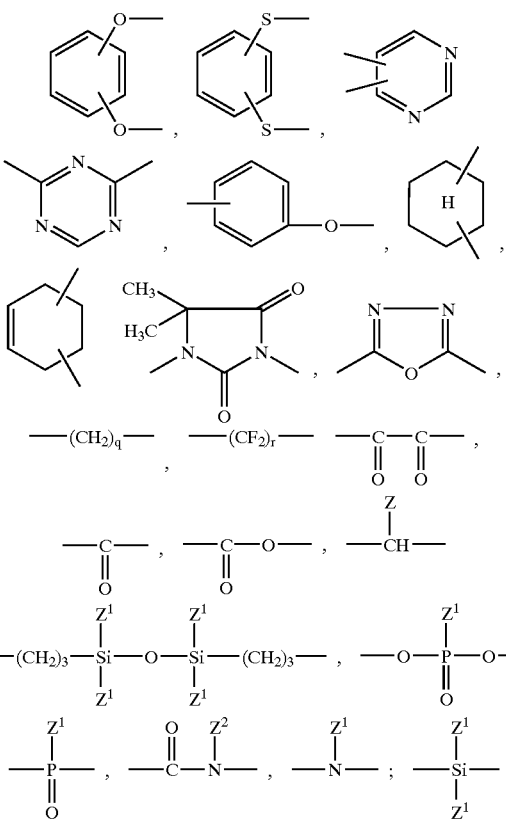

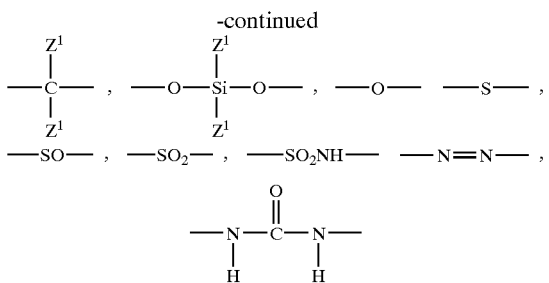

in which q is from 2 to 14 and r is from 2 to 18 and $Z^1$ is a group 3) mentioned below and $Z^2$ is a group 4) mentioned below.

2) Z is selected from the following groups:
H and C1 to C6 alkyl groups;
3) $Z^1$ is selected from the following groups:
C1 to C10 alkyl groups and aryl;
4) $Z^2$ is selected from aryl and heteroaryl groups.

II) The group $R^1$ in the above-mentioned general formulae C) and D) is selected from the following groups:

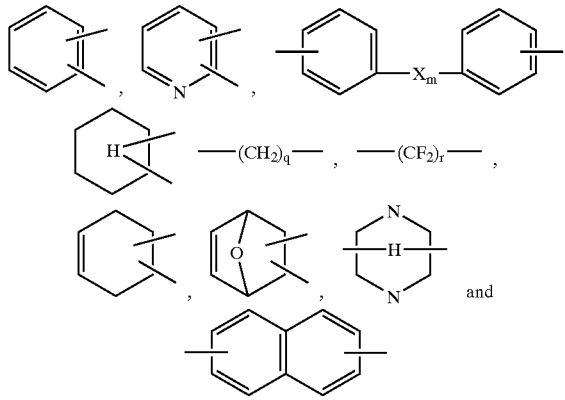

where X represents the groups indicated above and m is 0 or 1 and q is from 2 to 14 and r is from 2 to 18.

The dye component absorbs the light used to expose the photoresist, with the consequence that the layer-forming composition is antireflective. From the dye classes mentioned above, the following dyes are preferred in each case.

From the class of the azo dyes: chrysophenine, Direct Yellow 50 (Aldrich Chemie), Direct Yellow 27 (Aldrich Chemie), Cibacron brilliant yellow, methyl orange, and para red.

From the class of the methine dyes: 3-ethyl5-[2-(3-methylthiazolidin-2-ylidene)ethylidene]-2-thioxooxazoliding-4-one and 5-(4-dimethylamino-benzylidene)rhodanine.

From the class of the azomethine dyes: phenol blue, N-(4-ethyloxybenzylidene)-4-butylaniline, and N,N-terephthalylidenebis(4-butylaniline).

From the class of the coumarin dyes: coumarin 6, coumarin 7, and coumarin 152.

From the class of the triphenylmethane dyes: crystal violet, crystal ponceau 6R, malachite green, fuchsin, and benzaurin.

In these systems, the poly(hydroxyamide) and/or polybenzoxazole serves as the base polymer, embedded within which there is at least one of the afore-mentioned dyes. The dyes are lodged in the polymer matrix without being connected to it by chemical bonds. This has the advantage of particularly simple preparation of the antireflective composition of the invention without the need for additional reactive groups for linking the dyes to the base polymer. The base polymers have the advantage of possessing stability to temperatures above 450° C. and, preferably above 480° C. The inclusion of at least one of the dyes allows a high level of absorption of light in a very broad wavelength range below 450 nm.

The invention further provides an antireflective configuration of layers in which disposed on a substrate there is an antireflective layer which contains one of the above-mentioned antireflective compositions of the invention. Disposed on the antireflective layer is a photoresist layer.

The antireflective layer of the invention has a dielectric constant of, for example, less than 3, whereby electrical coupling through the antireflective layer is relatively low. When the antireflective layer of the invention is coated with a photoresist, an advantageous and surprising result is that no interlayer is formed at the boundary between the photoresist and the antireflective layer.

In comparison, the coating of a simple poly (hydroxyamide) might result in the formation of an interlayer. The interlayer is formed when, for example, the photoresist reacts with the antireflective layer or the photoresist superficially dissolves the antireflective layer, so that the interlayer is formed in this reaction area or dissolution area, respectively. The interlayer is, for example, of very low solubility and may remain on the antireflective layer. Moreover, the interlayer may adversely affect the exposure properties of the photoresist. It is therefore advantageous that the antireflective layer of the invention is chemically inert with respect to photoresists.

Accordingly, the inventive mixing of a base polymer with a dye exhibits an unexpected positive effect. Furthermore, the light absorption of the antireflective layer of the invention is higher than would be expected from the simple combination of the absorption of the individual components.

In a multi-layer system, the bottom resists have the further function of acting as an antireflective layer. Consequently, the bottom resist is subject to the same requirements imposed on an antireflective layer.

Consequently it is advantageous if an antireflective layer and/or bottom resist adheres very well to the substrate and can be removed later, for example, by etching.

Furthermore, it is desirable and advantageous if the bottom resist and/or the antireflective layer can remain on the substrate following its use as an antireflective layer and etch mask. In this case the bottom resist may act, for example, as an electrical insulation or as a mechanical protection.

With regard to the process, the object of the invention is achieved by a process for producing a configuration of layers including the antireflective layer. The process includes preparing a solution of poly(hydroxyamide) and at least one dye from the dye classes of methine dyes, methine derivatives, azomethine dyes, azomethine derivatives, coumarin dyes, coumarin derivatives, triphenylmethane dyes, triphenylmethane derivatives, or an azo dye in a solvent. The substrate is coated with the solution so that an antireflective layer is applied to the substrate. A resist layer is applied to the antireflective layer.

The layer-forming antireflective composition applied to the substrate can be used as an antireflective layer and has the advantages described in connection with the solution of the subject claim.

A further process step, provides for drying the antireflective layer and the substrate prior to adding the resist layer. This improves the durability of the antireflective layer.

In the course of the process of drying it is possible to heat the antireflective layer during the drying only to temperatures less than 250° C. This prevents conversion of the poly(hydroxyamide) present in the antireflective layer into polybenzoxazole. The advantage of this is that poly (hydroxyamide) can be removed more effectively by an organic solvent such as N-methylpyrrolidone, for example, than can polybenzoxazole.

Alternatively, it is also possible to heat the antireflective layer to a temperature of at least 250° C. This permits condensation of the poly(hydroxyamide) into polybenzoxazole. Polybenzoxazole has the advantage over poly (hydroxyamide) of increased etch resistance. For example, polybenzoxazole is chemically resistant to a large number of acids, bases, and organic solvents, which are present, for example, in photoresists or are suitable for removing photoresists. Moreover, polybenzoxazole is substantially more thermally stable than poly(hydroxyamide), being thermally stable for temperatures of up to 500° C.

In the process, it is possible to use solvents selected from the following: N-methylpyrrolidone (NMP), γ-butyrolactone, cyclohexanone, ethyl lactate, diethylene glycol monoethers, and diethylene glycol diethyl ether. It is also possible to use combinations of the solvents. The solvents and/or solvent combinations are advantageously suitable for dissolving poly(hydroxyamide) and the aforementioned dye components.

In the process, the solution may be filtered before the substrate is coated. This filters out any impurities, thereby improving the quality of the solution.

In the course of the process, the layer-forming antireflective composition in the form of a solution may be applied to the substrate alternatively by spin coating, brushing or spraying.

Other features which are considered as characteristic for the invention are set forth in the appended claims.

Although the invention is illustrated and described herein as embodied in an antireflective, a layer-forming composition, layer configuration containing an antireflective layer, and a process for producing the antireflective layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, sectional view of a substrate having a surface on which an antireflective layer and a resist layer are disposed according to the invention.

DESCRIPTION OF THE PREFERRED EMBODIMENTS

Referring now to the single figure of the drawing, there is shown a substrate 5 having a surface 10. Disposed on the substrate surface 10 is an antireflective layer 15. Disposed on the antireflective layer 15 is a resist layer 20. The resist layer 20 is photoreactive, for example, so that it can be used for an exposure process. In accordance with the invention, the antireflective layer 15 contains poly(hydroxyamide) or polybenzoxazole, with at least one of the substances methine, a methine derivative, azomethine, an azomethine derivative, coumarin, a coumarin derivative, triphenylmethane, a triphenylmethane derivative, an azo compound, or any combination of these dyes, being additionally present in the antireflective layer 15.

In order to produce the configuration depicted in the figure a solution is prepared which contains poly (hydroxyamide) and at least one of the following substances: methine, a methine derivative, azomethine, an azomethine derivative, coumarin, a coumarin derivative, triphenylmethane, a triphenylmethane derivative, or an azo compound. As a solvent of the solution it is possible, for example, to use N-methylpyrrolidone, γ-butyrolactone, cyclohexanone, ethyl lactate, diethylene glycol monoethers, or diethylene glycol diethyl ethers.

The solution is subsequently filtered in order to remove impurities from the solution. Next, the surface 10 of the substrate 5 is coated with the solution, the antireflective layer 15 being applied to the substrate surface 10. The coating of the substrate surface 10 with the antireflective layer 15 can be carried out, for example, by a spin coating, by a spray application or by a brush application. Thereafter, the antireflective layer 15 and the substrate 5 are dried. The antireflective layer 15 is heated to a temperature of at least 250° C., as a result of which the poly(hydroxyamide) present in the antireflective layer is converted into polybenzoxazole. The conversion of poly(hydroxyamide) at least partly into polybenzoxazole here is optional. The resist layer 20 is subsequently applied to the antireflective layer 15. The layer sequence thus formed is suitable for subsequent photolithographic exposure.

We claim:

1. A layer-forming antireflective composition, comprising:

a base polymer containing at least one of poly (hydroxyamide) and polybenzoxazole; and a dye component selected from the group consisting of methine dyes, methine dye derivatives, azomethine dyes, azomethine dye derivatives, coumarin dyes, coumarin dye derivatives, triphenylmethane dyes, triphenylmethane dye derivatives, azo dyes, and azo dye derivatives;

said poly(hydroxyamide) and polybenzoxazole being formed from a monomer having a formula C) or D):

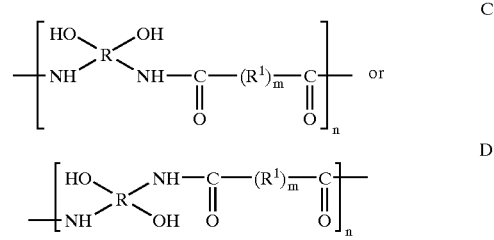

n being an integer between 2 and 100 and m is 0 or 1;

R being an aromatic or heteroaromatic substituent selected from the group consisting of:

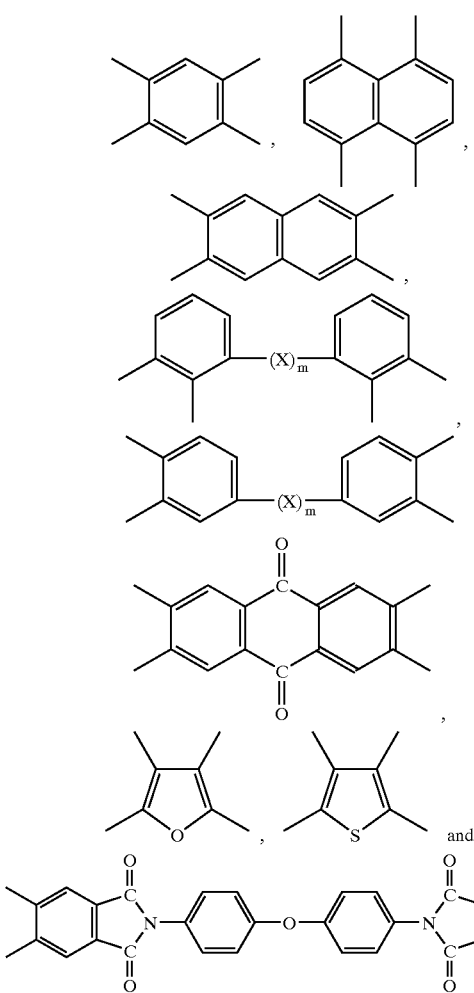
m being 0 or 1; and
X being a substituent selected from the group consisting of:
-continued
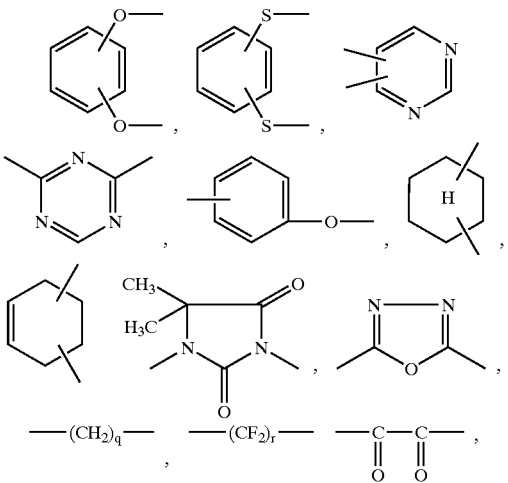
Y being a radical selected from the group consisting of:
Z being a substituent selected from the group consisting of H and C1 to C6 alkyl groups; and
E being a radical selected from the group consisting of:

-continued

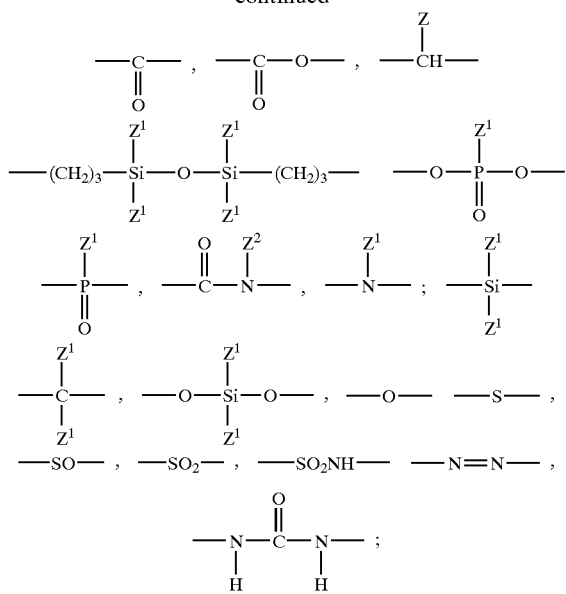

q being from 2 to 14;
r being from 2 to 18;
$Z^1$ being a substituent selected from the group consisting of C1 to C10 alkyl groups and an aryl group;
$Z^2$ being a substituent selected from an aryl group and a heteroaryl group;
$R^1$ being a substituent selected from the group consisting of:

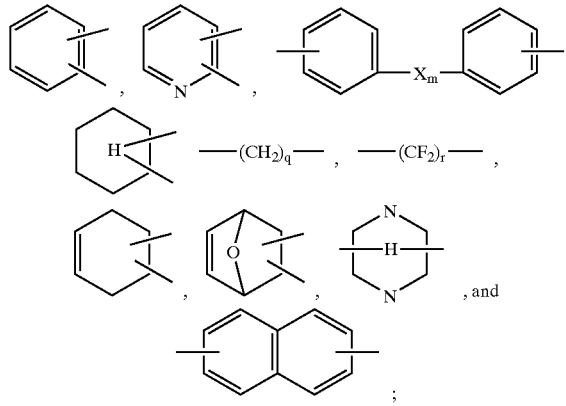

q being from 2 to 14; and
r being from 2 to 18.

2. A layered configuration, comprising:
a substrate;
an antireflective layer disposed on said substrate and made from the layer-forming antireflective composition according to claim 1; and
a resist layer disposed on said antireflective layer.

3. A process for producing a layered configuration, which comprises the steps of:
preparing a solution of poly(hydroxyamide) and at least one dye in a solvent, the dye being selected from the group consisting of methine dyes, methine dye derivatives, azomethine dyes, azomethine dye derivatives, coumarin dyes, coumarin dye derivatives, triphenylmethane dyes, triphenylmethane dye derivatives, azo dyes, and azo dye derivatives;
coating a substrate with the solution resulting in an antireflective layer being applied to the substrate; and
applying a resist layer on the antireflective layer to form the layered configuration according to claim 2.

4. The process according to claim 3, which comprises drying the antireflective layer and the substrate before applying the resist layer.

5. The process according to claim 4, which comprises heating the antireflective layer to temperatures less than 250° C. during the drying step.

6. The process according to claim 4, which comprises heating the antireflective layer to a temperature of at least 250° C. during the drying step.

7. The process according to claim 3, which comprises selecting the solvent from the group consisting of N-methylpyrrolidone, γ-butyrolactone, cyclohexanone, ethyl lactate, diethylene glycol monoethers, and diethylene glycol diethyl ether.

8. The process according to claim 3, which comprises filtering the solution prior to performing the coating of the substrate step.

9. The process according to claim 3, which comprises during the coating step, applying the solution to the substrate by spin coating.

10. The process according to claim 3, which comprises during the coating step, applying the solution to the substrate by spraying.

11. The process according to claim 3, which comprises during the coating Step, applying the solution to the substrate by brushing.

12. The layer-forming antireflective composition according to claim 1,
wherein said dye component is selected from the group consisting of chrysophenine, Direct Yellow 50, Direct Yellow 27, Cibacron brilliant yellow, methyl orange, para red, 3-ethyl 5- [2-(3-methylthiazolidin-2-ylidene) ethylidene]-2-thioxooxazolidin-4-one, 5-(4-dimethylaminobenzylidene)rhodanine, phenol blue, N-(4-ethyloxybenzylidene)-4-butylaniline, N,N-terephthalylidenebis(4-butylaniline), coumarin 6, coumarin 7, coumarin 152, crystal violet, crystal ponceau 6R, malachite green, fuchsin, and benzaurin.

* * * * *